United States Patent [19]
Gamble et al.

[11] Patent Number: 5,801,124
[45] Date of Patent: Sep. 1, 1998

[54] LAMINATED SUPERCONDUCTING CERAMIC COMPOSITE CONDUCTORS

[75] Inventors: Bruce B. Gamble, Wellesley; Gilbert N. Riley, Jr., Marlborough; John D. Scudiere, Bolton; Michael D. Manlief, Westborough; David M. Buczek, Needham; Gregory L. Snitchler, Shrewsbury, all of Mass.

[73] Assignee: American Superconductor Corporation, Westborough, Mass.

[21] Appl. No.: 701,333

[22] Filed: Aug. 30, 1996

[51] Int. Cl.$^6$ .......................... H01L 39/00; H01B 12/00
[52] U.S. Cl. .......................... 505/230; 505/211; 505/704; 174/125.1; 428/930
[58] Field of Search .................... 505/230, 430, 505/704, 211; 174/125.1; 427/62; 428/930

[56] References Cited

U.S. PATENT DOCUMENTS

| | | | |
|---|---|---|---|
| 4,617,789 | 10/1986 | Borden | 57/6 |
| 5,059,582 | 10/1991 | Chung | 505/1 |
| 5,104,849 | 4/1992 | Shiga et al. | 505/1 |
| 5,116,809 | 5/1992 | Tsuno et al. | 505/1 |
| 5,151,406 | 9/1992 | Sawada et al. | 505/1 |
| 5,312,802 | 5/1994 | Hayashi et al. | 505/211 |
| 5,372,991 | 12/1994 | Hayashi et al. | 505/211 |

FOREIGN PATENT DOCUMENTS 03-110806  5/1991  Japan .

OTHER PUBLICATIONS

S.X. Dou et al.; "Effect of Silver on Phase Formation and Superconducting Properties of Bi-2223/Ag Tapes"; vol. 5, No. 2, pp. 1830–1833, Jun. 1995; University of Wollongong, Wollongong, Australia.

Primary Examiner—Roy V. King
Attorney, Agent, or Firm—Fish & Richardson P.C.

[57] ABSTRACT

The invention provides a superconducting ceramic laminate including a superconducting tape mechanically coupled to, and compressively strained to 0.1% or more under a predetermined load by, at least one cladding tape. The material and thickness of the cladding tape or tapes are selected relative to the material and thickness of the superconducting tape to locate the neutral axis so that, under a predetermined heavy load, the maximum compressive strain on any superconducting portion of the superconducting tape is less than the critical compressive strain and the maximum tensile strain on any superconducting portion of the superconducting tape under a predetermined load is less than the critical tensile strain. By "heavy load" is meant a load on the laminate equivalent to a load on the unlaminated superconducting tape selected for the laminate including a surface bend strain on the unlaminated superconducting tape of at least 0.1%. The laminate provides high critical current capacity, improved strain tolerance, superior critical current retention, and high packing factors. Articles comprising the laminates, such as coils and cables, are also provided.

24 Claims, 11 Drawing Sheets

Example 1

Example 1

LAMINATED SUPERCONDUCTING CERAMIC COMPOSITE CONDUCTORS

FIELD OF THE INVENTION

This invention relates to superconducting articles which require high surface bend strains on their superconducting components during manufacture or operation, and to superconducting ceramic laminates useful in fabricating these articles.

BACKGROUND OF THE INVENTION

Since the discovery of oxide superconducting materials with transition temperatures above about 20 Kelvins, the possibility of using them to obtain greater efficiency in electrical and magnetic applications has attracted considerable interest. Although superconducting oxides have brittle, ceramic-like structures which cannot by themselves be drawn into wires or similar conductor forms using conventional metal-processing methods, progress has been made in manufacturing superconducting oxide conductors with high engineering current capacity as composite structures in which filaments or layers of the superconducting oxides are supported by a matrix material, typically a noble metal, that adds mechanical robustness to the composite.

To be practical outside the laboratory, most electrical and magnetic applications require that the conductor be manufacturable at reasonable cost in long, flexible forms which tolerate considerable mechanical strain, in addition to having high current-carrying capacity. However, the performance of high temperature superconducting composites is significantly degraded by even low levels of strain, and particularly by tensile strain, which reduces available current density due to microcracking which disrupts the current paths through the filaments. For most ceramic superconducting composites, the critical current is independent of the amount of tensile strain placed on the composite until the strain reaches a threshold value, commonly referred to as the critical strain of the material, but referred to herein as the critical tensile strain to distinguish it from the critical compressive strain discussed later. Above that threshold, the critical current value decreases asymptotically with increasing tensile strain due to formation of localized microcracks in the material. In typical superconducting oxide filaments, for example, available current density begins to drop at bends which create only a fraction of a percent of strain, depending on the filament cross-section and material. Although methods for repairing microcracking which occurs during processing are known, if the local tensile strain is greater than the critical strain value, micro-crack formation can occur to such an extent that significant healing during a later thermomechanical processing step becomes impossible. No methods are presently known for repairing microcracking which occurs during use. When either of these happen, portions of the filament revert to partially superconducting or totally resistive states, with high power losses per unit area.

The tolerance of a superconducting article for compressive strain is typically significantly higher than its tolerance for tensile strain, but losses in available current density are also associated with relatively low levels of compressive strain, on the order of about 1% to about 3%, and a threshold value, the critical compression strain, may also be identified in applications where the strain on the composite is purely compressive.

Strain tolerance is a consideration in a number of important applications. When an elongated article is bent to form a cable or coil, for example, a tensile strain is inevitably generated in some portion of the article, and a compressive strain in some other portion. Moreover, the stress generated by heating and cooling, Lorentz forces and mechanical fatigue, when, for example, a high-field magnet coil is turned on and off, creates additional strain during the use of the article. In both the tensile and compressive cases, tolerance for repeated strains is typically lower than tolerance for unitary strains.

Numerous applications, including the high field magnets used in magnetic separation devices and MRI magnets, require high critical current densities, relatively small conductor packing factors, surface bend strains on the superconductor in excess of about 0.1%, and current retention ratios in excess of 80%, and preferably 95% despite repeated strains caused by many of the factors identified above.

Efforts have been made to satisfy these requirements by forming thin film oxide superconductor layers on very thin, flexible fiber or film substrates. However, the robustness and total current-carrying capacity of these forms is limited by their small size.

Efforts have also been made to satisfy these requirements by creating a preliminary compressive strain in a deposited oxide superconductor layer relative to a substrate and then bending in such a way that the oxide superconductor layer is always radially external to the substrate. Such composites are not well-adapted for handling the non-uniform stresses which occur during the use, for example, of a high field magnet coil.

Therefore, it is an object of this invention to provide a superconducting ceramic laminate suitable for forming a high performance superconducting ceramic articles for these applications.

It is a further object of this invention to provide strain tolerant, high performing superconducting ceramic laminates having improved strain tolerance, better resistance to performance degradation and superior critical current retention.

SUMMARY OF THE INVENTION

The invention provides a superconducting ceramic laminate including a superconducting tape mechanically coupled to, and compressively strained to 0.1% or more under a predetermined load by, at least one cladding tape. The material and thickness of the cladding tape or tapes are selected relative to the material and thickness of the superconducting tape to locate the neutral axis so that, under a predetermined heavy load, the maximum compressive strain on any superconducting portion of the superconducting tape is less than the critical compressive strain and the maximum tensile strain on any superconducting portion of the superconducting tape under a predetermined load is less than the critical tensile strain. The laminate provides high critical current capacity, improved strain tolerance, superior critical current retention, and high packing factors. Articles comprising the laminates, such as coils and cables, are also provided.

In a first aspect of the invention, an article comprising a superconducting ceramic laminate in accordance with the invention includes a superconducting tape at least about 25 micrometers thick comprising a superconducting ceramic, and a first cladding tape which is mechanically coupled to the superconducting tape, the material and thickness of the cladding tape being selected relative to the material and thickness of the superconducting tape so that, under a predetermined heavy load, the neutral axis of the laminate is located between the outermost and innermost superconducting portions of the superconducting tape (putting the outermost superconducting portions under compression and the innermost superconducting portions under tension), the distance between the neutral axis and the innermost superconducting portion of the tape is such that the strain on the innermost superconducting portion of the tape is less than the critical tensile strain, and the distance between the neutral axis and the outermost superconducting portion of the tape is such that the strain on the outermost superconducting portion of the tape is less than the critical compressive strain.

In a second aspect of the invention, an article comprising a superconducting ceramic laminate in accordance with the invention includes a superconducting tape at least about 25 micrometers thick comprising a superconducting ceramic, and a first cladding tape which is mechanically coupled to the superconducting tape, the material and thickness of the cladding tape being selected relative to the material and thickness of the superconducting tape so that, under a predetermined heavy load, the neutral axis of the laminate is located between the outermost superconducting portions of the superconducting tape and the exposed face of the cladding tape (putting all superconducting portions of the superconducting tape are under compression) and the distance between the neutral axis and the innermost superconducting portion of the tape is such that the strain on the innermost superconducting portion of the tape is less than the critical compressive strain.

In particular aspects, the laminate also comprises a second cladding tape mechanically coupled to the face of the superconducting tape opposite the first cladding tape.

By "neutral axis" is meant a surface defined by those points within the article which experience neither tensile nor compressive strain during a predetermined loading of the article.

By "superconducting portion" is meant any portion of the superconducting tape substantially comprising the superconducting ceramic, such as a superconducting filament or coating layer. By "outermost superconducting portion" is meant the superconducting portion closest to the junction between the superconducting tape and the first cladding tape and by "innermost superconducting portion" is meant the superconducting portion furthest from the junction of the superconducting tape and the first cladding tape.

In order to maximize the packing factor of the laminate, the cross-sectional area of each cladding tape should be no more than twice the cross-sectional area of the superconducting tape. Preferably, the cross-sectional area of each cladding tape should be no more than the cross-sectional area of the superconducting tape. Each cladding tape is preferably selected to possess a yield stress at least as great as the yield stress of the superconducting tape, and an elastic modulus at least half as large as the elastic modulus of the superconducting tape. In preferred embodiments, each cladding tape is selected to possess a yield stress greater than the yield stress of the composite article, and an elastic modulus greater than the elastic modulus of the composite article. Preferably, the second cladding tape is also selected to possess a yield stress and elastic modulus which are lower than that of the first cladding tape, although two tapes of the same material but different thicknesses will also suffice to move the neutral axis toward the first cladding tape in particular embodiments. The cladding tapes may be made from a variety of metal or flexible ceramic materials but preferably comprise copper, nickel, iron, aluminum, alloys and superalloys of these materials, or flexible zirconium oxide and most preferably stainless steel or nickel alloy. In some embodiments, the second cladding tape may be made of an insulating material such as zirconia.

By "mechanically coupling", as that term is used herein, is meant, for example lamination, metallurgical bonding, press bonding, overbanding, welding, ultrasonic welding, epoxying, gluing or soldering, to obtain sufficient adherence between a broad face of the superconducting tape and the corresponding face of the cladding tape that substantial mechanical alignment of the tapes in the laminate may be maintained during subsequent fabrication and use of a desired article.

By "predetermined load" is meant the cumulation of any bend, strain or stress which may be applied to the laminate or required by the design of the article in which the laminate is used. Loading be applied during, for example, fabrication or use of the desired article, as well as by thermal or electromagnetic forces inherent in the design. The load may vary in magnitude and direction along the length of the laminate. It may be applied partially during fabrication and partially during use, as when a magnet coil is subject to hoop stresses during use. By "heavy load" is meant a load on the laminate equivalent to a load on the unlaminated superconducting tape selected for the laminate including the load associated with a surface bend strain on the unlaminated superconducting tape of at least 0.1%. In typical heavy load applications, there will be a surface bend strain of at least 0.1% if a design using an unlaminated superconducting tape is chosen. In one aspect, typically preferred for uniform loads, the first cladding tape is everywhere radially external to the superconducting tape under a predetermined loading of the laminate. In another aspect of the invention, typically preferred for non-uniform loads, the first cladding tape is at least partially external to the superconducting tape under a predetermined loading of the laminate.

The invention may be practiced with any desired superconducting ceramic, preferably one of the superconducting oxides. Members of the bismuth family, and particularly its 2212 and 2223 phases, are particularly preferred. Members of the yttrium rare earth family, and particularly its 123, 124, and 247 phases are also particularly preferred.

In preferred embodiments, the superconducting tape also comprises a matrix material supporting or substantially surrounding the superconducting portions. The matrix material may be a metal or flexible ceramic tape. In preferred embodiments, the matrix material includes a noble metal. By "noble metal" is meant a metal whose reaction products are thermodynamically unstable under the reaction conditions employed relative to the desired superconducting ceramic, or which does not react with the superconducting ceramic or its precursors under the conditions of manufacture of the composite. The noble metal may be a metal different from the metallic elements of the desired superconducting ceramic, such as silver, oxide dispersion strengthened (ODS) silver, a silver alloy or a silver/gold alloy, but it may also be a stoichiometric excess of one of the metallic elements of the desired superconducting ceramic, such as copper. Silver (Ag), ODS silver, silver alloys and silver/gold alloys are the most preferred noble metals.

All or a portion of the superconducting tape may be superconducting. In a preferred aspect, the superconducting tape comprises a plurality of filaments extending along the length of the tape, each filament comprising a superconducting ceramic. In another aspect, the superconducting tape is a coated conductor.

In another aspect, the invention is a method for manufacturing a high performance superconducting article comprising the steps of: first, forming a superconducting tape at least about 25 micrometers thick and comprising a superconducting ceramic; next, forming a first cladding tape of a selected material and thickness, the material and thickness of the first cladding tape being selected in relation to the material and thickness of the superconducting tape and a predetermined load including a surface bend strain on the unlaminated superconducting tape of at least 0.1%, to locate the neutral axis of the combined tapes so that the maximum compressive strain on any superconducting portion of the superconducting tape under a predetermined heavy load is less than the critical compressive strain and the maximum tensile strain on any superconducting portion of the superconducting tape under the predetermined heavy load is less than the critical tensile strain, and, finally, mechanically coupling the cladding tape to the superconducting tape to form a laminate.

In another aspect, the invention is a method for manufacturing a high performance superconducting article comprising the steps of: first, forming a superconducting tape at least about 25 micrometers thick having a pair of opposite faces and comprising a superconducting ceramic; next, forming a first cladding tape of a first selected material and thickness, next, forming a second cladding tape of a second selected material and thickness the material and thickness of the cladding tapes being selected in relation to the material and thickness of the superconducting tape and a predetermined load including a surface bend strain on the unlaminated superconducting tape of at least 0.1%, to locate the neutral axis of the combined tapes so that the maximum compressive strain on any superconducting portion of the superconducting tape under a predetermined heavy load is less than the critical compressive strain and the maximum tensile strain on any superconducting portion of the superconducting tape under the predetermined heavy load is less than the critical tensile strain, and, finally, mechanically coupling the first and second cladding tapes to opposite faces of the superconducting tape to form a laminate.

In one aspect, the invention further comprises the step of winding the laminate with the first cladding tape radially external to the superconducting tape along at least a portion of the laminate to form a desired superconducting article. In another aspect, the invention further comprises the step of winding the laminate with the first cladding tape radially external to the superconducting tape along the entire length of the laminate to form a wound article such as a coil or helical cable.

BRIEF DESCRIPTION OF THE DRAWINGS

The foregoing and other features, objects, aspects and advantages of the invention will become more apparent from the detailed description of the preferred embodiments which follows, and from the drawings, in which.

DETAILED DESCRIPTION OF THE PREFERRED EMBODIMENTS

Figure 1:
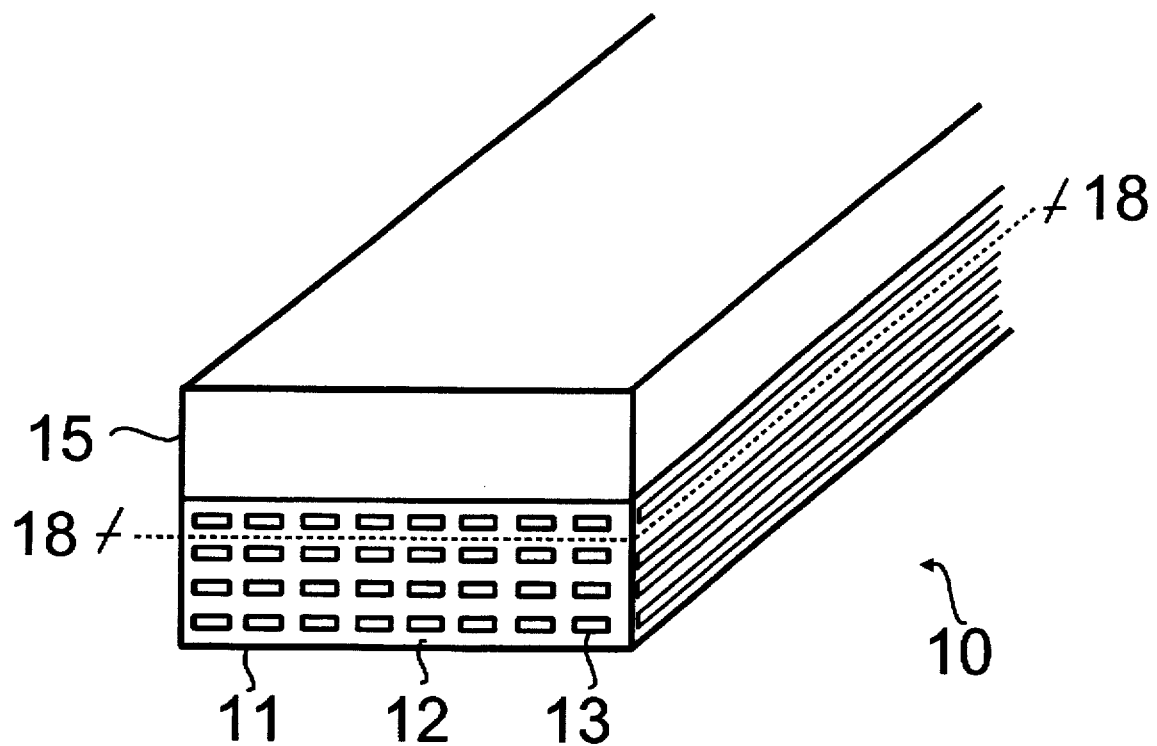
FIG. 1 is a schematic diagram of a longitudinal cross-section of a two-layer superconducting ceramic composite article made in accordance with a first embodiment of the invention.

The inventors have found that engineering the superconducting laminate to increase its equivalent stiffness and place the neutral axis in a desirable position results in marked improvements in product quality. Below the critical tensile strain and critical compressive strain values of a superconducting tape, the inventors have found that adverse effects of strain on the current carrying capacity of the superconducting tape at these levels are largely limited to the superconducting portions of the tape. While superconducting tapes are complex systems in which the matrix materials may exhibit non-linear plastic behaviors and interactions between the matrix and superconducting portions must be taken into account, the inventors have found that, for symmetric geometries at very low levels of strain, both tensile and compressive strain vary substantially linearly with distance from the neutral axis. Thus, for a laminate using a superconducting tape of predetermined thickness, the effect of varying the local thickness of the cladding tape on the location of the neutral axis may be determined in accordance with well-known methods for calculating the neutral axes and stresses on composite beams, as described for example in *Warren C. Young, "Roark's Formulas For Stress And Strain", 6th Edition, Chapter 7*. FIG. 1 is a schematic diagram of a vertical cross-section of a two-layer superconducting ceramic laminate 10 made in accordance with a first embodiment of the invention. The laminate 10 comprises a highly aspected cladding tape 15 mechanically coupled to a highly aspected superconducting tape 11. Adding a cladding tape to one side of the superconducting tape shifts the neutral axis, shown as plane 18 in FIG. 1, in the direction of the junction of the cladding tape and the superconducting tape.

The superconducting tape 11 comprises a matrix 12 surrounding a plurality of filaments which comprise a superconducting ceramic material. Filament 13 is located at the outermost superconducting portion of the tape and filament 14 is located at the innermost superconducting portion of the tape. By "outermost superconducting portion" is meant the superconducting portion closest to the junction 17 between the superconducting tape and the cladding tape and by "innermost superconducting portion" is meant the superconducting portion furthest from the junction of the superconducting tape and the cladding tape. Other forms of superconducting tape, such as monofilamentary tapes, may also be used. In a monofilamentary tape, for example, the outermost superconducting portion will be the edge of the monofilament closest to the junction of the superconducting tape and the cladding tape, and the innermost superconducting portion will be the opposite edge of the monofilament. These superconducting portions typically will not be on the surfaces of the superconducting tape. In multifilamentary composite superconducting tapes such as that shown in FIG. 1, for example, the innermost and outermost superconducting filaments may be located as much as several micrometers from the surfaces of the superconducting tape and the surfaces of the superconducting tape typically consist of a non-superconducting matrix material. In accordance with the first embodiment of the invention, the material and thickness of the cladding tape is selected relative to the material and thickness of the superconducting tape to place the neutral axis of the laminate between the outermost and innermost superconducting portions of the superconducting tape at a point where the distance between the neutral axis and the innermost superconducting portion of the tape is such that the strain there under a predetermined load is less than the critical tensile strain, and the distance between the neutral axis and the outermost superconducting portion of the tape is such that the strain there under a predetermined load is less than the critical compressive strain. Thus, the outermost superconducting portions including filament 13 are under compression and the innermost superconducting portions including filament 14 are under tension but no filament is under a strain which exceeds either its critical compressive strain or its critical tensile strain. The neutral axis 18 is preferably located at a distance from the junction 17 of the superconducting tape and cladding tape which is less than half the thickness of the superconducting tape, in order to take advantage of the relative strength of the superconducting material under compression.

Figure 2:
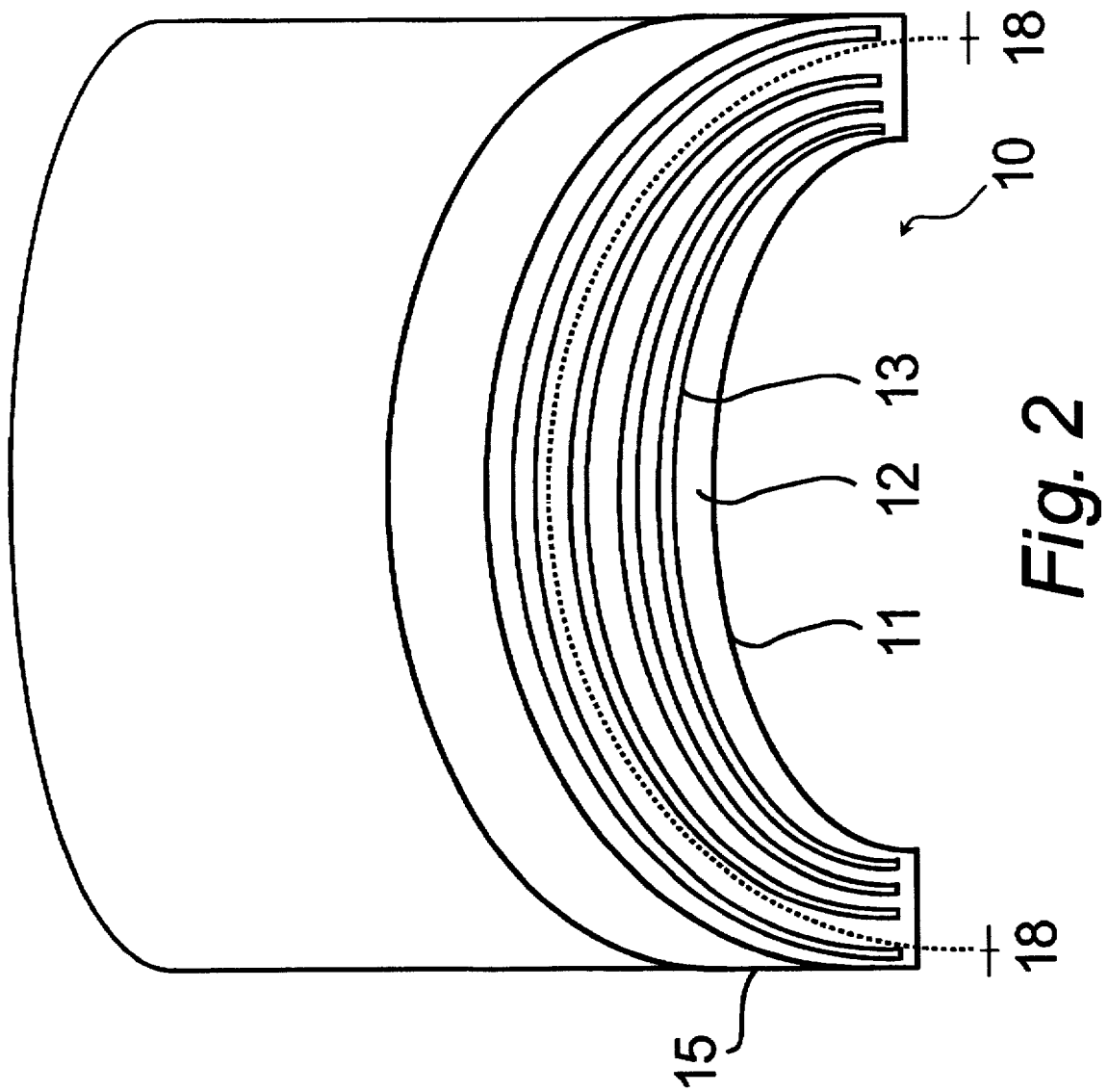
FIG. 2 is a schematic diagram of a longitudinal cross-section of the article shown in FIG. 1 when subject to unidirectional, uniform bending.

If the article is to be loaded by unidirectional bending, as in a toroidal or pancake coil, then the cladding tape is placed external to the superconducting tape on bending, so that the highest tensile forces are localized in the cladding tape, as shown in FIG. 2. If the laminate is to be subject to uniform, unidirectional stresses in the article, the neutral axis is located at a uniform distance from the junction. In the simple case shown in FIGS. 1 and 2, the superconducting multifilaments are fine enough that the superconducting tape can be treated as a single material for strains below the critical tensile strain and, thus, the thickness of the cladding tape, h(c), is related to the thickness of the superconducting tape, h(s), is by h(c)=2n−[E(s)×h(s)]/E(c), where n is the distance from the unbonded face of the superconducting tape to the neutral axis, E(s) is the elastic modulus of the superconducting tape, and E(c) is the elastic modulus of the cladding tape. Most preferably, in this simplified case, the thickness of the cladding tape, h(c), is selected to place the neutral axis at a distance from the junction of the superconducting tape and cladding tape where the ratio of the distance between the outermost superconducting portion of the superconducting tape and the neutral axis to the critical tensile strain equals the ratio of the distance between the innermost portion of the superconducting tape and the neutral axis to the critical compressive strain, or in other words, which is the sum of the distance from the junction to the outermost superconducting portion of the tape plus T/C% of the distance between the innermost and outermost superconducting portions of the superconducting tape, where T is the critical tensile strain and C is the critical compressive strain.

Figure 3:
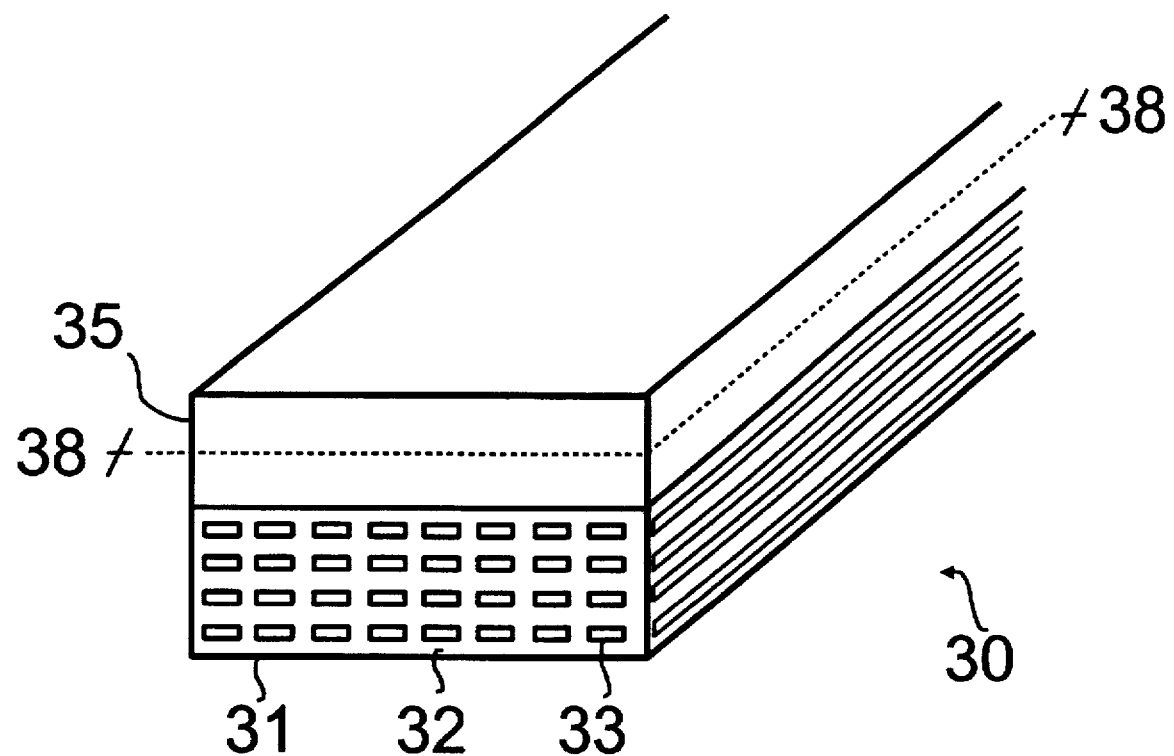
FIG. 3 is a schematic diagram of a longitudinal cross-section of a two-layer superconducting ceramic composite article made in accordance with a second embodiment of the invention.

FIG. 3 is a schematic diagram of a vertical cross-section of a two-layer superconducting ceramic laminate 30 made in accordance with a second embodiment of the invention. The laminate 30 comprises a highly aspected cladding tape 35 mechanically coupled to a highly aspected superconducting tape 31. Adding a cladding tape to one side of the superconducting tape offsets the neutral axis, shown as plane 38 in FIG. 3, in the direction of the junction of the cladding tape and the superconducting tape.

The superconducting tape 31 comprises a matrix 32 surrounding a plurality of filaments which comprise a superconducting ceramic material. Filament 33 is located at the outermost superconducting portion of the tape and filament 34 is located at the innermost superconducting portion of the tape. In accordance with the invention, the material and thickness of the first cladding tape is selected relative to the material and thickness of the superconducting tape such that the neutral axis of the laminate is located between the outermost superconducting portions of the superconducting tape and the exposed face of the first cladding tape and the distance between the neutral axis and the innermost superconducting portion of the tape is such that the strain there under the predetermined load is less than the critical compressive strain. Thus, the neutral axis of the laminate is displaced to a position radially external to the outermost superconducting portions of the superconducting tape so that the all superconducting portions of the superconducting tape are under compression but no filament is under a strain which exceeds either its critical compressive strain or its critical tensile strain. The embodiment shown in FIG. 3 may be preferred in order to take advantage of the relative strength of the superconducting material under compression or used at an intermediate stage in a manufacturing process where bidirectional bending or the highly non-uniform stresses caused by thermal cycling or hoop stress will eventually have to be compensated in a addition to an initial tensile strain.

Figure 4:
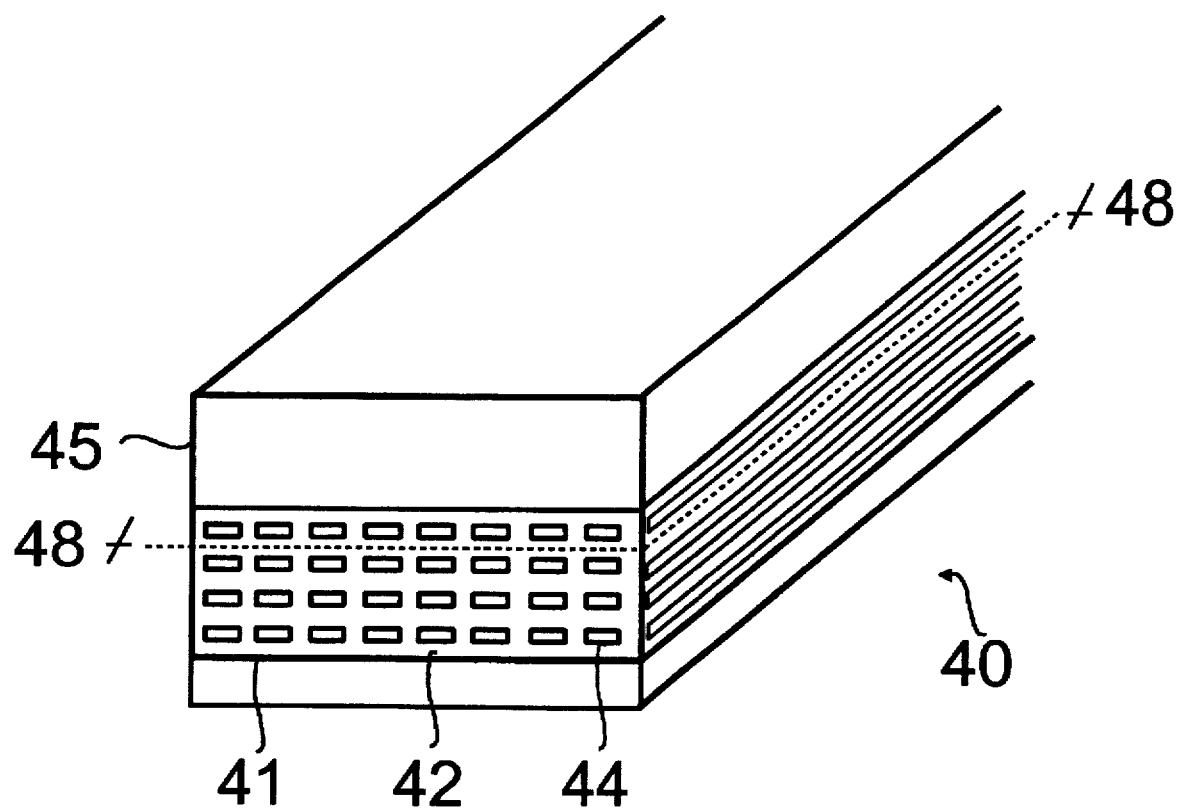
FIG. 4 is a schematic diagram of a longitudinal cross-section of a three-layer elongated superconducting ceramic article made in accordance with a second embodiment of the invention.

FIG. 4 is a schematic diagram of a vertical cross-section of a three-layer superconducting ceramic laminate 40 made in accordance with a second embodiment of the invention. It includes a superconducting tape 41 comprising a matrix 42 surrounding a plurality of filaments which comprise a superconducting ceramic material. Filament 43 is located at the outermost superconducting portion of the tape and filament 44 is located at the innermost superconducting portion of the tape. Laminate 40 further comprises a highly aspected first cladding tape 45 mechanically coupled to a highly aspected superconducting tape 41 along one of its broad faces. The laminate 40 further comprises a highly aspected second cladding tape 46 mechanically coupled to the opposite face of superconducting tape 41. The relative thicknesses and elastic moduli of the first cladding tape 45, and the second cladding tape 36 will determine whether the neutral axis, shown as plane 48 in FIG. 4, is offset in the direction of the first cladding tape or of the second cladding tape.

Figure 5:
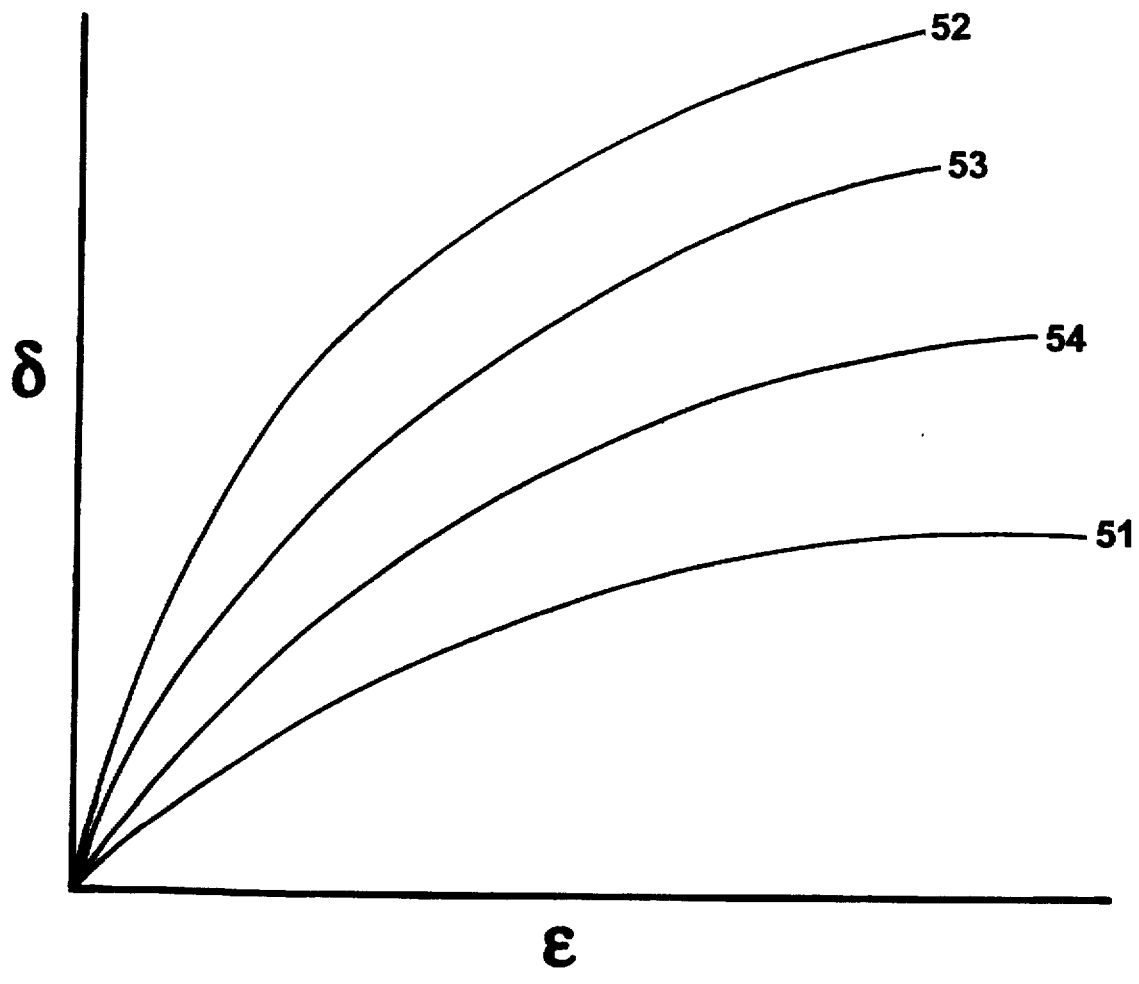
FIG. 5 is a chart showing stress as a function of strain for each of the tapes and the entire article of FIG. 4.

Although the selective displacement of the neutral axis will provide some benefits regardless of the materials chosen for the cladding tapes, in order to maximize the benefits of the invention, each of these tapes is preferably selected to possess a yield stress greater than the yield stress of the composite article, and an elastic modulus greater than the elastic modulus of the composite article. The preferred relationships are shown in FIG. 5, where the stress to strain relations for the laminate (curve 50), the superconducting tape (curve 51), the first cladding tape (curve 52) and the second cladding tape (curve 53).

In order to assure adequate packing factors and overall laminate current densities, the cross-sectional area of each cladding tape should be no more than twice the cross-sectional area of the superconducting tape. The superconducting ceramic laminates are preferably elongated forms such as wires, tapes, or current leads, including highly aspected tapes with a width to thickness ratio greater than about 2:1, preferably greater than about 4:1 and most preferably greater than about 10:1. They may comprise twisted or untwisted filaments. Generally speaking, thinner, higher modulus cladding tapes are preferred over thicker, lower modulus tapes. However, it should be noted that the cladding tapes may serve other functions in addition to shifting the neutral axis. They may, for example, provide structural support, alternate current paths during failure modes, or added thermal mass. In some applications, they may provide protection against liquid cryogen contamination, as further described in U.S. Ser. No. 08/701,375, entitled "Cryogen Protected Superconducting Ceramic Tape", by John D. Scudiere and David M. Buczek, filed of even date, which is herein incorporated in its entirety by reference. Any or all of these other requirements may limit the suitable materials choices for the cladding tapes. Preferably, the materials of the cladding and second cladding tapes have coefficients of thermal expansion at cryogenic temperatures within about 50% of the coefficient of thermal expansion of the superconducting tape.

The invention may be practiced with any desired superconducting ceramic. The compounds are preferably superconducting oxides, and especially of the bismuth, rare earth, thallium, lead or mercury families of superconducting copper oxides. Members of the bismuth family, and particularly its 2212 and 2223 phases, are particularly preferred. Members of the yttrium rare earth family, and particularly its 123, 124, and 247 phases are also particularly preferred.

Laminates may be manufactured in accordance with the invention by first, forming a superconducting tape at least about 25 micrometers thick and comprising a superconducting ceramic. Tapes made by any method, including the well-known powder-in-tube and coated conductor methods, may be used. Next, the material and thickness of the first cladding tape is selected in relation to the material and thickness of the superconducting tape (and the second cladding tape, if one is required) and a predetermined load including a surface bend strain on the unlaminated superconducting tape of at least 0.1%, to locate the neutral axis of the combined tapes so that the maximum compressive strain on any superconducting portion of the superconducting tape under a predetermined load is less than the critical compressive strain and the maximum tensile strain on any superconducting portion of the superconducting tape under a predetermined load is less than the critical tensile strain, and a first cladding tape of the selected material and thickness is formed or obtained. If a second cladding tape is required, the material and thickness of the second cladding tape is selected in relation to the material and thickness of the superconducting tape and first cladding tape and a predetermined load, to locate the neutral axis of the combined tapes so that the maximum compressive strain on any superconducting portion of the superconducting tape under a predetermined load is less than the critical compressive strain and the maximum tensile strain on any superconducting portion of the superconducting tape under a predetermined load is less than the critical tensile strain, and a second cladding tape of the selected material and thickness is formed or obtained. For a laminate using only a first cladding tape, the following equations may be used to solve for the thickness of the first cladding tape once a material has been selected:

$\sigma = (t^2/2 + \{t[I] \times E[I]/E[s]\} \times t] + \{t[I]^2/2 \times E[I]/E[s]\})/(t + t[I] \times E[I]/E[s])$ $\epsilon[c] = (\{t - 2t[s]\} + \{\sigma - t/2\})/2R$ $\epsilon[t] = (\{t - 2t[s]\} - \{\sigma - t/2\})/2R$ $R = \{t - 2t[s]\}/2\epsilon$, where $\epsilon = \epsilon[t]$ for the tensile calculation and $\epsilon = \epsilon[c]$ for the compressive calculation, and where $\sigma$ = the displacement of the neutral axis caused by the addition of the laminate $\epsilon[c]$ = critical compressive strain $\epsilon[t]$ = critical tensile strain $E[I]$ = the elastic modulus of the first cladding tape $E[s]$ = the elastic modulus of the superconducting tape $t[I]$ = the thickness of the first cladding tape $t[s]$ = the thickness of the portion of the superconducting tape outside the innermost and outermost superconducting portions $t$ = the thickness of the superconducting tape $R$ = the radius of curvature Finally, the first cladding tape is mechanically coupled to the superconducting tape to form a laminate. Methods and apparatus for laminating superconducting tapes are described in more detail in U.S. Ser. No. 08/705,811, entitled "Laminated Superconducting Ceramic Tape" by John D. Scudiere, David M. Buczek, Gregory L. Snitchler and Paul J. Di Pietro, filed of even date, which is herein incorporated in its entirety by reference and "Cryogen Protection", supra. One or both of the cladding tapes may be pretensioned, as described in "Laminated", supra to provide additional compression for the superconducting tape.

The determination of the material and thicknesses of the cladding tapes may be done iteratively. In preparing laminates for use in a high-field magnet coil, for example, the material of the cladding tapes and the overall cross-section of the laminate may be computed by considering the hoop stress requirement of the magnet design, and the decision to use one or two cladding tapes and the distribution of cross-section among the two tapes may then be determined.

The invention provides superconducting ceramic laminates and articles comprising them which have improved strain tolerance, improved Jc's and better resistance to mechanical and electrical performance degradation. Critical current retention of 90% or more, and preferably 95% or more may be observed in articles manufactured from the laminates even when subject to surface bend strains in excess of about 0.1%. Bent and twisted articles such as coils and cables may be manufactured form the laminates, and they are particularly suitable for articles such as high-field magnets, generators, and motors.

The invention may be further understood from the following examples:

EXAMPLE 1

A superconducting tape containing 127 BSCCO 2223 filaments in a silver and ODS silver matrix was made in accordance with the oxide-powder-in tube method, as described for example, U.S. patent application Ser. No. 08/467,033 entitled "Processing Of (Bi,Pb) SCCO Superconductor In Wires And Tapes", filed Jun. 6, 1995, or U.S. patent application Ser. No. 08/468,089, entitled "Improved Deformation Process for Superconducting Ceramic Composite Conductors", filed Jun. 6, 1995 which are herein incorporated by reference, by packing a BSCCO precursor powder into a pure silver billet, drawing down the billet to form monofilamentary wire, cutting the wire into 127 equal pieces and rebunding the pieces into an ODS tube which was then inserted into a pure silver tube, which was further reduced by drawing and rolling to form a tape, and heat treated to convert the precursor powder into BSCCO 2223. The finished tape had dimensions of 0.007" by 0.100", an outer silver wall thickness of 0.001", and a fill factor of about 38%. Fill factor is the ratio of the area of superconducting filaments to the overall area of the tape in a vertical cross-section of the tape.

Figure 6:
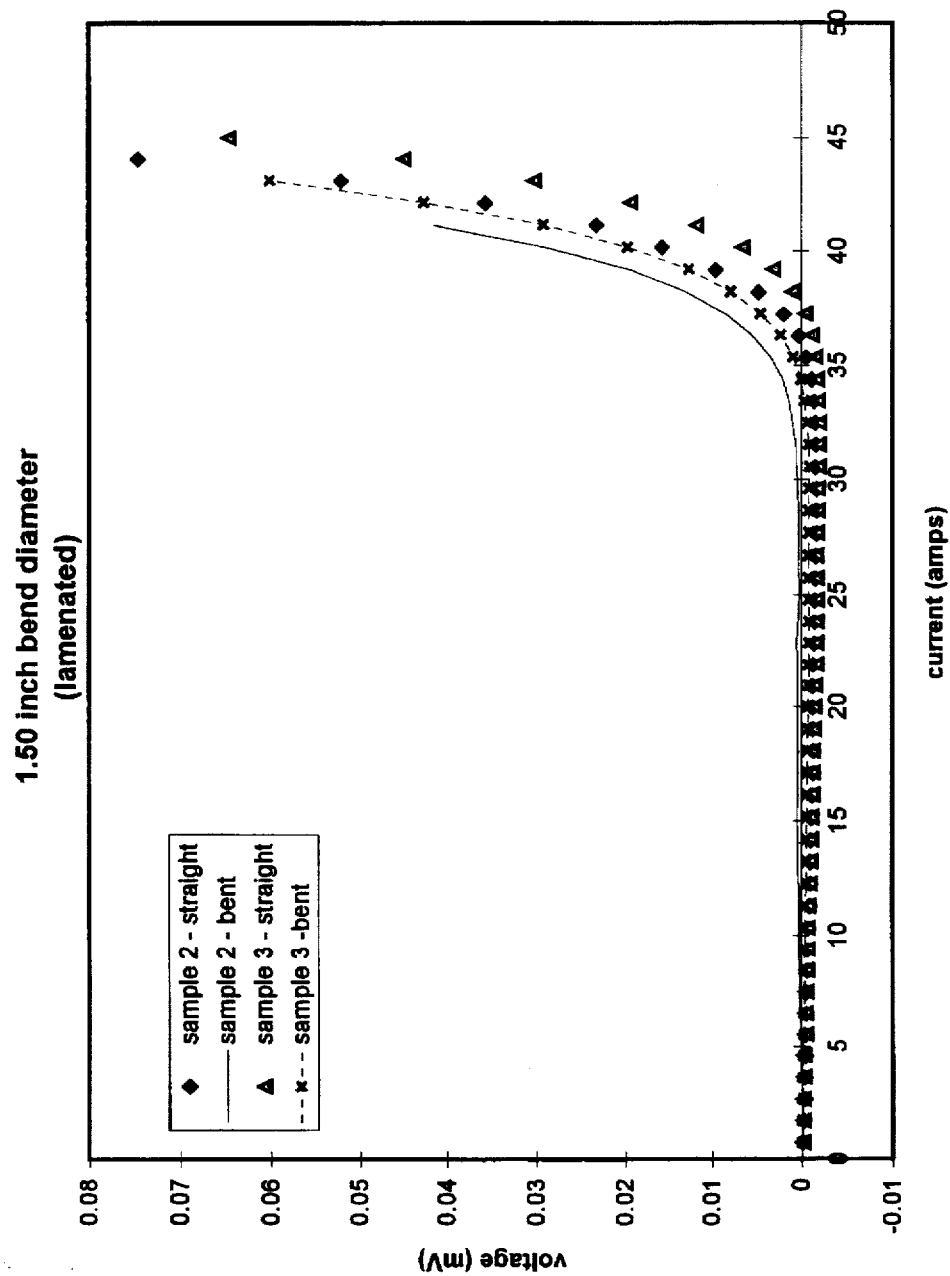
FIG. 6 is a graph showing average Jc retention for laminates made in accordance with the invention as further described in Example 1.
Figure 7:
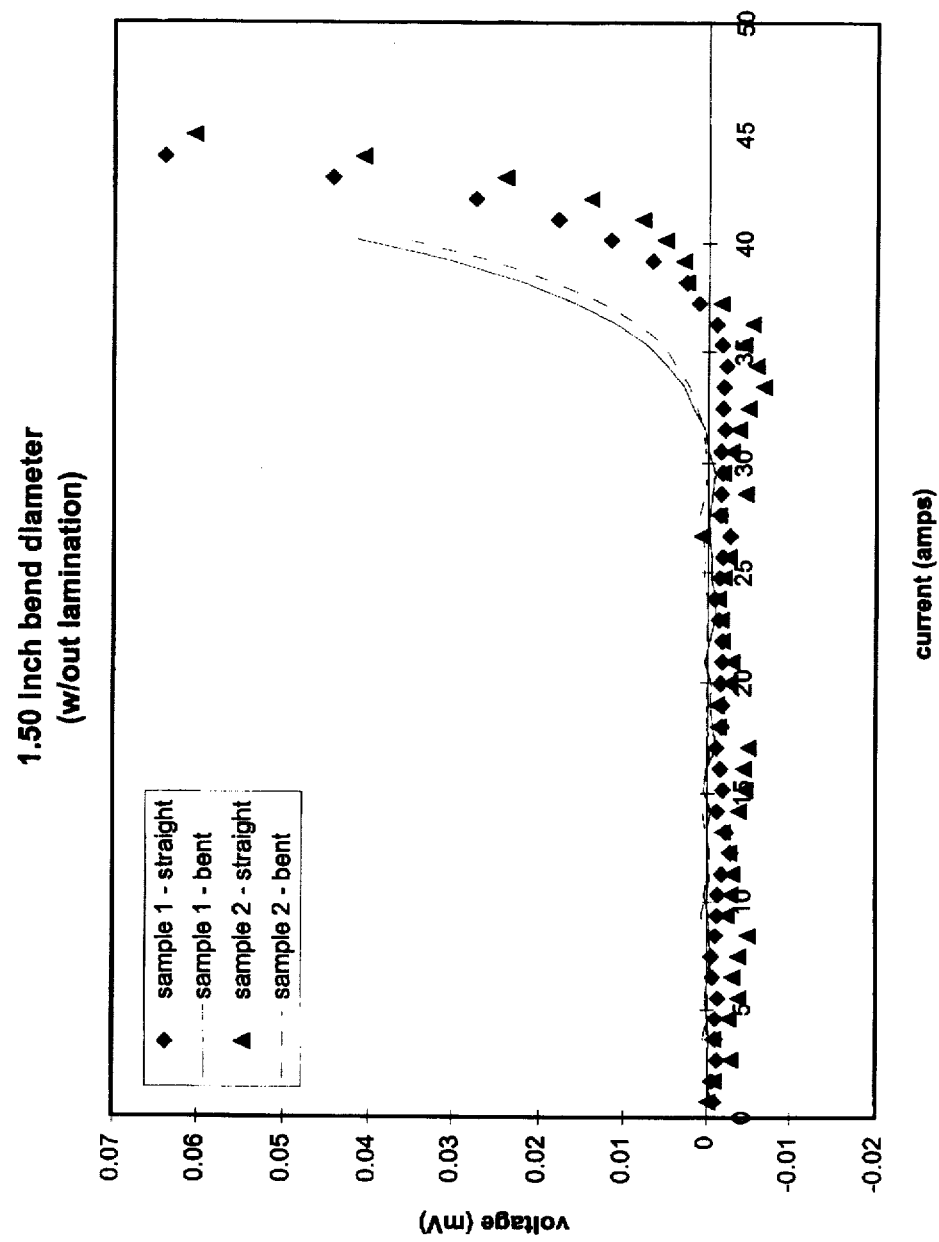
FIG. 7 (prior art) is a graph showing average Jc retention for an unlaminated superconducting tapes, as further described in Example 1.

The superconducting tape was then divided into two portions. One portion was laminated to a fully annealed 304 SS (stainless steel) cladding tape of dimension 0.002" by 0.100", by the following process: The superconducting tape was cleaned to improve its bonding surface. Both the superconducting tape and the cladding tape were pretinned by hand with a SnPb solder. The two tapes were soldered together with a hand iron, and three short samples were cut from each of the laminated and unlaminated tapes. The critical current and current retention curves were measured first on straight laminated and unlaminated samples, and then on the samples bent to a bend diameter of 1.5". Best two-out-of-three results for the laminated samples are shown in FIG. 6 and for the unlaminated samples in FIG. 7. On average, the unlaminated tapes had a critical current retention (Ic/Ico) of 88.9% at a 1.50" bend diameter. The laminates had a critical current retention (Ic/Ico) of 94.2% at a 1.50" bend diameter.

EXAMPLE 2

As a further example, a superconducting tape may be made by the process of Example 1 with a thickness of 0.25 mm containing 10–1000 ultrafine superconducting ceramic filaments in a pure silver matrix (with no ODS silver layers). The innermost and outermost filaments are located about 0.025 mm from the innermost and outermost edges, respectively, of the tape. The Young's Modulus of the tape is similar to the Young's modulus of silver with a value of $70 \times 10^9$ Pa. The critical tensile strain of the tape is about 0.005 and the critical compressive strain is about 0.02. If this tape were to be bent to a predetermined radius of curvature, the maximum tensile strain in the tape would occur on the outside of the tape in the bend and the maximum compressive stress would occur on the inside of the bend. The magnitude of these maximums is determined by the radius of the bend. Plugging these numbers into the equations set forth above, any radius of curvature less than about 2 cm would strain at least the outermost filaments beyond their critical tensile strain, resulting in a reduction of the current carrying capability of the tape. The greater the radius of curvature, the greater the degradation of the tape. At a radius of curvature less than about 0.5 cm, the innermost filaments would be strained beyond their critical compressive strain, resulting in a further reduction of the current carrying capability of the tape.

The addition of a silver cladding tape with a thickness of 0.1 mm radially external to the superconducting tape in would move the neutral axis radially outward by 0.05 mm. The radius of curvature which can be tolerated without degradation of current carrying capability is thereby decreased from about 2 cm to about 1.5 cm.

EXAMPLE 3

A superconducting tape made as in Example 2 may be laminated with a stainless steel tape instead of a silver tape. By increasing the Youngs modulus of the lamination the same effect can be achieved with a thinner lamination. A 0.05 mm thick stainless lamination with a Young's modulus of $190 \times 10^9$ Pa would provide $\epsilon[c]$ of 0.843% and $\epsilon[t]$ of 0.0049%, about the same improvements in filament strain conditions as the 0.05 mm silver lamination described in Example 2.

EXAMPLE 4

A superconducting tape containing 85 BSCCO 2223 filaments in a silver and ODS silver matrix was made as generally described in Example 1.

Figure 8:
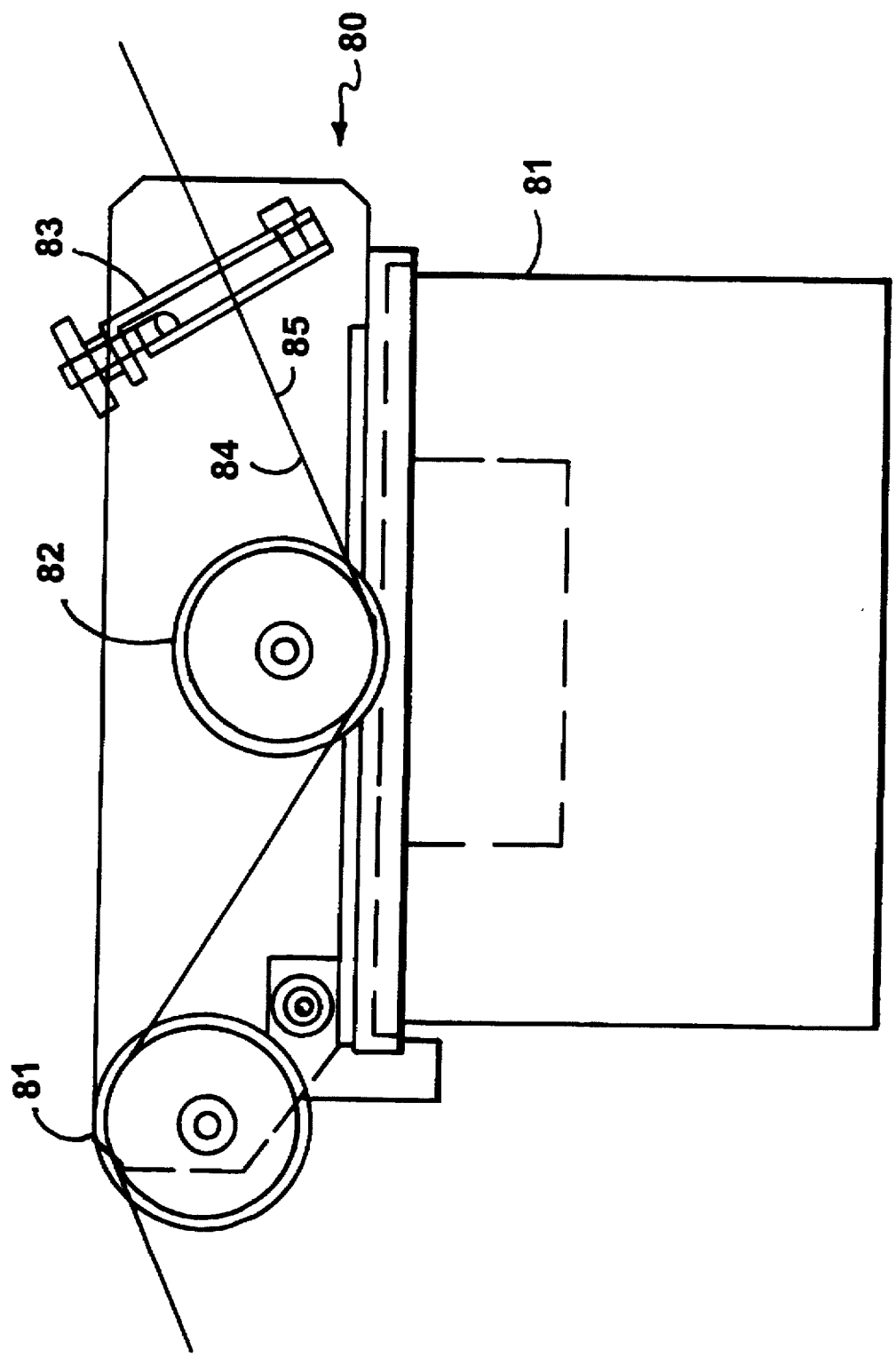
FIG. 8 is an apparatus for testing the tolerance of tapes to bend strain.

The tape (nominal dimensions of 8×160 mil) was laminated using the apparatus shown in FIG. 8 and described below. As shown in FIG. 8, the apparatus 80 includes a rectangular solder pot 81 with a two steel rolls 81 and 82 and a viton wipe assembly 83. The first roll 81 is slotted to guide the tape into the solder pot. The second roll in 82 the solder is to keep the superconducting tape 84 and laminate 85 aligned and together during the soldering process. The viton wipe 83 compresses the tapes together to minimize solder buildup at the interface and surface of the laminates.

Apparatus and methods as described in "Laminated", supra and "Cryogen Protection", supra could also have been used.

Samples that were laminated with this apparatus were pretinned (laminate only) and then fluxed. One meter sections were processed with this system and samples were then cut for mechanical testing.

In particular, a single 1.8 mil thick stainless steel strip was soldered to the superconducting tape using a Pb—Sn solder. The resulting laminate was about 10×160 mil. A total of one meter was made. The as-laminated Ic values ranged from 45 to 74 A at 77K and self field. Ic degradation was not observed for 6 thermal cycles.

Bend tests were run in two modes. In one case the superconductor was radially external to the laminate. In the other case the superconductor radially internal to the laminate. The test involved the sequence of (i) measure the self field the Ic at 77K using a standard four point probe technique of the unbent laminate, (ii) bend to the next smaller bend diameter, (iii) measure the self field the Ic at 77K using a standard four point probe technique of the unconstrained laminate, and (iv) go to (ii).

Three two inch long samples were bent such that the superconductor layer was put in tension (that is the superconductor layer was on the outside of the bend). In this case, Ic degradation was observed for all three samples on the first bend to a diameter of 3". The magnitude of degradation increased as the magnitude of surface bend strain (with the superconductor in tension) increased, as shown in Table 1.

Figure 9A:
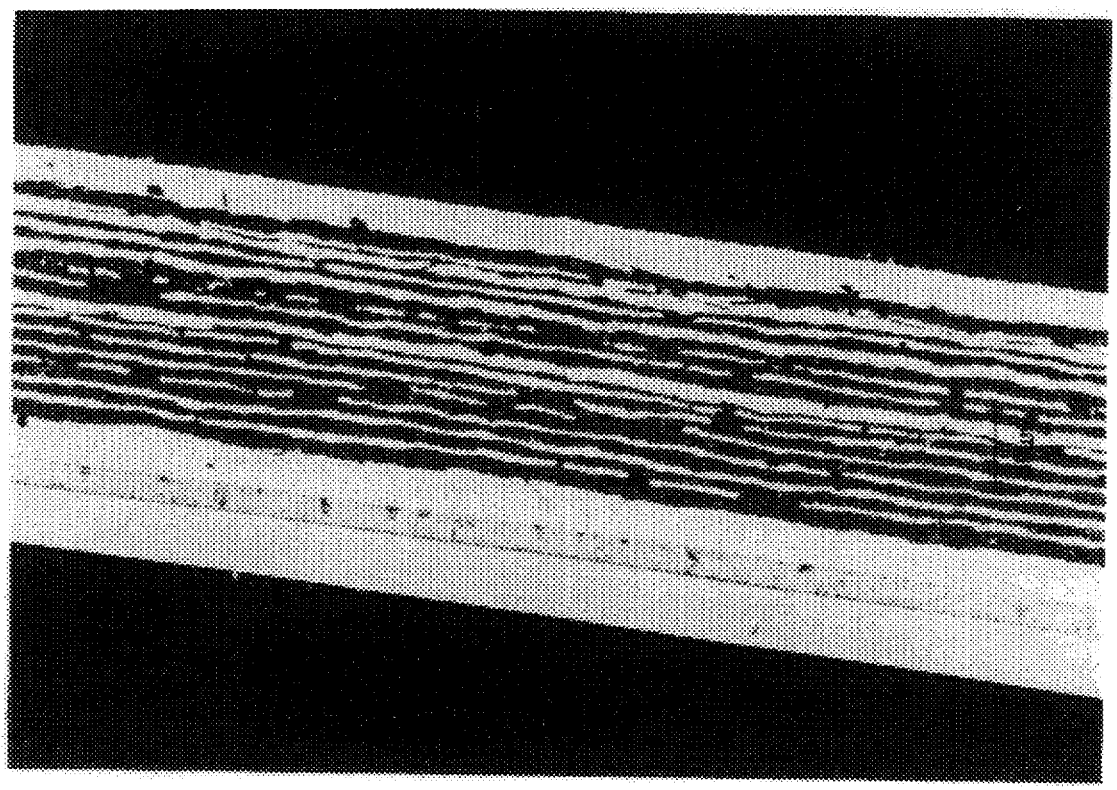
FIGS. 9(a), 9(b) and 9(c) show longitudinal sections of laminates after the thermal cycling test (a), the superconducting layer in tension with a 1" bend diameter (b), and the superconducting layer in compression with a 1" bend diameter (c).
Figure 9B:
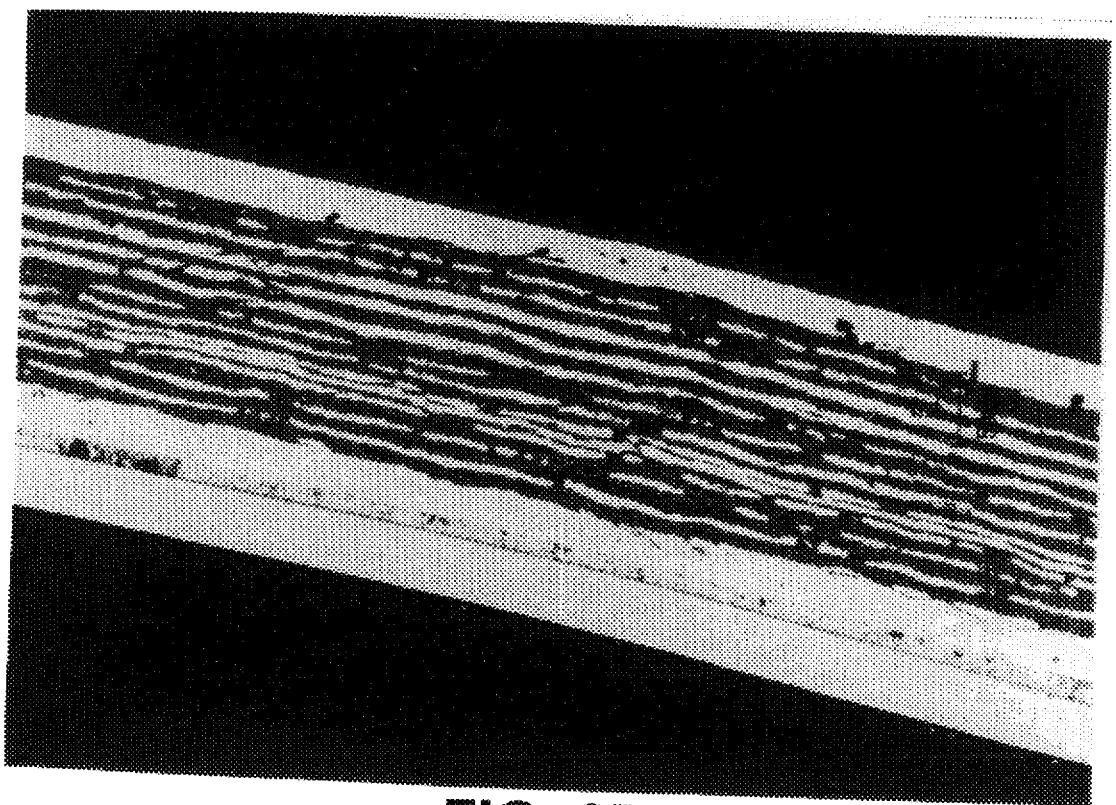
Figure 9C:
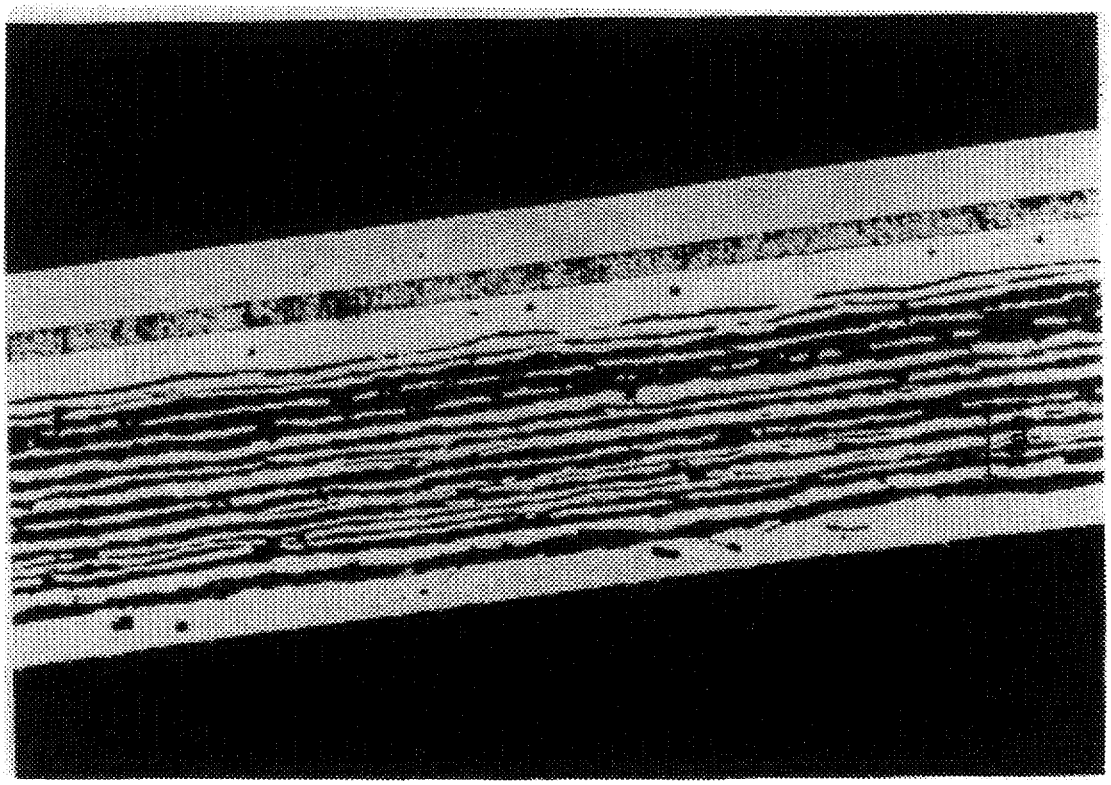

Three two inch long samples were bent such that the superconductor layer was put in compression (that is the superconductor layer was on the inside of the bend). In this case, Ic degradation was not observed until a bend diameter of 1.5" was reached. FIGS. 9(a), 9(b) and 9(c) show longitudinal sections of laminates after the thermal cycling test (a), the superconducting layer in tension with a 1" bend diameter (b), and the superconducting layer in compression with a 1" bend diameter (c). In (a) the stainless steel strip is at bottom, and the 85 filament superconducting layer is on top. In (b), cracks can clearly be seen across the superconducting filaments; these cracks limit supercurrent transport. In contrast, no cracks are visible in the superconducting filaments in (a) or (c). From this bend diameter onward, the magnitude of degradation increased as the magnitude of surface bend strain (with the superconductor in compression) increased, as shown in Table 1.

TABLE I (Ic AT 77K, SELF FIELD IN AMPS)

Thermal Cycling Experiment

| SAMPLE NAME | DIAMETER | Ic 1st CYCLE | Ic 2nd CYCLE | Ic 3rd CYCLE | Ic 4th CYCLE | Ic 5th CYCL | Ic 6th CYCLE |
|---|---|---|---|---|---|---|---|
| LAM 1-C 1A | No Bend | 53.41 | 53.61 | 53.79 | 53.31 | 53.36 | 53.81 |
| LAM 1-C 1B | No Bend | 45.88 | 45.99 | 46.40 | 45.92 | 45.98 | 46.19 |
| LAM 1-C 2A | No Bend | 54.03 | 55.14 | 53.28 | 52.28 | 53.35 | 53.81 |
| LAM 1-C 2B | No Bend | 58.51 | 58.72 | 58.62 | 58.39 | 58.19 | 58.90 |
| LAM 1-C 3A | No Bend | 73.81 | 73.24 | 73.44 | 72.37 | 72.69 | 73.97 |
| LAM 1-C 3B | No Bend | 72.95 | 68.28 | 72.09 | 71.85 | 70.86 | 70.54 |

Mechanical Cycling Experiment

| DIAMETER | No Bend | 3" | 2.85" | 2.25" | 2" | 1.5" | 1.25" | 1" |
|---|---|---|---|---|---|---|---|---|
| LAM 1-A HTS in Tension | 51.37 | 47.59 | 43.78 | 31.01 | 26.31 | 16.45 | 9.69 | 4.06 |
| LAM 1-A HTS in Tension | 53.67 | 49.90 | 46.11 | 32.73 | 25.41 | 14.62 | 2.89 | 0.49 |
| LAM 1-A HTS in Tension | 51.88 | 49.40 | 44.39 | 32.62 | 26.51 | 13.55 | 6.84 | 0.75 |
| LAM 1-B HTS in Compression | 44.24 | 44.27 | 44.18 | 44.41 | 44.30 | 25.18 | 9.23 | 6.18 |
| LAM 1-B HTS in Compression | 51.12 | 50.65 | 51.30 | 50.73 | 51.11 | 13.30 | 6.59 | 2.31 |
| LAM 1-B HTS in Compression | 44.74 | 43.51 | 44.38 | 44.00 | 43.48 | 34.57 | 11.97 | 6.18 |

It should be readily apparent to those skilled in the art that the methods and advantages of the present invention may be used in superconducting ceramic articles having a variety of compositions and morphologies. The description and examples are set forth in the specification for the purposes of illustration only and are by no means intended to be limiting of the invention. The scope and nature of the invention are set forth in the claims which follow.

What is claimed is:

1. A superconducting ceramic laminate adapted for use under a predetermined heavy load, comprising:

a superconducting tape comprising a superconducting ceramic having a critical tensile strain and a critical compressive strain, and a first cladding tape mechanically coupled to the superconducting tape, the material and thickness of the first cladding tape being selected relative to the material and thickness of the superconducting tape to locate the neutral axis of the laminate so that, under the predetermined heavy load, the maximum compressive strain on any superconducting portion of the superconducting tape is less than the critical compressive strain and the maximum tensile strain on any superconducting portion of the superconducting tape under the predetermined heavy load is less than the critical tensile strain.

2. A superconducting ceramic laminate according to claim 1 wherein the cross-sectional area of the first cladding tape is no more than twice the cross-sectional area of the superconducting tape.

3. A superconducting ceramic laminate according to claim 1 wherein the first cladding tape is selected to possess a yield stress at least as great as the yield stress of the superconducting tape.

4. A superconducting ceramic laminate according to claim 3 wherein the first cladding tape is selected to possess a yield stress greater than the yield stress of the superconducting ceramic laminate.

5. A superconducting ceramic laminate according to claim 1 wherein the first cladding tape is selected to posses an elastic modulus at least half as large as the elastic modulus of the superconducting tape.

6. A superconducting ceramic laminate according to claim 5 wherein the first cladding tape is selected to possess an elastic modulus greater than the elastic modulus of the superconducting ceramic laminate.

7. A superconducting ceramic laminate according to claim 1 wherein the cladding tape comprises one of copper, nickel, iron, aluminum, alloys and superalloys of these materials, flexible zirconium oxide or zirconia.

8. A superconducting ceramic laminate according to claim 1 wherein the superconducting ceramic comprises a superconducting oxide.

9. A superconducting ceramic laminate according to claim 8 wherein the superconducting oxide comprises one of the 2212 and 2223 phases of the bismuth family and the 123, 124, and 247 phases of the yttrium rare earth family.

10. A superconducting ceramic laminate according to claim 1 wherein the superconducting tape further comprises a metal or flexible ceramic matrix material supporting or substantially surrounding the superconducting portions.

11. A superconducting ceramic laminate according to claim 10 wherein the matrix material is one of silver, oxide dispersion strengthened (ODS) silver, a silver alloy or a silver/gold alloy.

12. A superconducting ceramic laminate according to claim 1 wherein the superconducting tape comprises a plurality of filaments extending along the length of the tape, each filament comprising a superconducting ceramic.

13. A superconducting laminate according to claim 1 wherein the superconducting tape is a coated conductor.

14. A superconducting magnet, wire, tape, current lead or cable comprising the superconducting laminate of claim 1.

15. A superconducting magnet coil comprising the superconducting laminate of claim 1.

16. A superconducting ceramic laminate according to claim 1 wherein superconducting tape has opposite faces and the laminate also comprises a second cladding tape mechanically coupled to the face of the superconducting tape opposite the first cladding tape.

17. A superconducting ceramic laminate according to claim 16 wherein the cross-sectional area of the second cladding tape is no more than twice the cross-sectional area of the superconducting tape.

18. A superconducting ceramic laminate according to claim 16 wherein the second cladding tape is selected to possess a yield stress and elastic modulus which are lower than those of the first cladding tape.

19. A superconducting ceramic laminate according to claim 16 wherein the first and second cladding tapes are selected to be of the same material but the first cladding tape is thicker than the second cladding tape.

20. A superconducting magnet, wire, tape, current lead or cable comprising the superconducting laminate of claim 16.

21. A superconducting ceramic laminate comprising:

a superconducting tape at least about 25 micrometers thick comprising a superconducting ceramic, having a critical tensile strain and a critical compressive strain, and a first cladding tape which is mechanically coupled to the superconducting tape, the material and thickness of the cladding tape being selected relative to the material and thickness of the superconducting tape so that, under a predetermined heavy load, the neutral axis of the laminate is located between the outermost and innermost superconducting portions of the superconducting tape, the distance between the neutral axis and the innermost superconducting portion of the tape is such that the strain on the innermost superconducting portion of the tape is less than the critical tensile strain, and the distance between the neutral axis and the outermost superconducting portion of the tape is such that the strain on the outermost superconducting portion of the tape is less than the critical compressive strain.

22. A superconducting magnet, wire, tape, current lead or cable comprising the superconducting laminate of claim 21.

23. A superconducting ceramic laminate comprising:

a superconducting tape at least about 25 micrometers thick comprising a superconducting ceramic, and a first cladding tape which is mechanically coupled to the superconducting tape, the material and thickness of the cladding tape being selected relative to the material and thickness of the superconducting tape so that, under a predetermined heavy load, the neutral axis of the laminate is located between the outermost superconducting portions of the superconducting tape and the exposed face of the cladding tape and the distance between the neutral axis and the innermost superconducting portion of the tape is such that the strain on the innermost superconducting portion of the tape is less than the critical compressive strain.

24. A superconducting magnet, wire, tape, current lead or cable comprising the superconducting laminate of claim 23.

* * * * *